(12) United States Patent
Zheng et al.

(10) Patent No.: US 8,532,153 B2
(45) Date of Patent: Sep. 10, 2013

(54) THERMAL CHIRP COMPENSATION IN A CHIRP MANAGED LASER

(75) Inventors: Xueyan Zheng, Andover, MA (US); Jianying Zhou, Acton, MA (US); Vincent Bu, Wilmington, MA (US); Daniel Mahgerefteh, Los Angeles, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 13/493,849

(22) Filed: Jun. 11, 2012

(65) Prior Publication Data

US 2012/0251130 A1    Oct. 4, 2012

Related U.S. Application Data

(62) Division of application No. 12/495,460, filed on Jun. 30, 2009, now Pat. No. 8,199,785.

(51) Int. Cl.
*H01S 3/00* (2006.01)
*H01S 3/04* (2006.01)

(52) U.S. Cl.
USPC .............................. 372/33; 372/34

(58) Field of Classification Search
USPC ............... 372/33, 34, 38.08, 29.02, 29.011, 372/38.01, 38.02; 398/187, 193, 199
See application file for complete search history.

(56) References Cited

U.S. PATENT DOCUMENTS 6,864,553 B2 *   3/2005  Epitaux et al. ............... 257/433
2006/0078338 A1 * 4/2006  Johnson et al. ............. 398/187

* cited by examiner

*Primary Examiner* — Armando Rodriguez
(74) *Attorney, Agent, or Firm* — Maschoff Brennan

(57) ABSTRACT

Thermal chirp compensation in a chirp managed laser. In one example embodiment, a laser package including a laser and an optical spectrum reshaper configured to convert frequency modulated optical signals from the laser into an amplitude modulated optical signals is provided. A thermal chirp compensation device is in communication with the laser package and a laser driver. The thermal chirp compensation device includes means for generating bias condition and temperature specific thermal chirp compensation signals that each corresponds to a predetermined level of thermal chirp that is induced in the laser by operating the laser at a particular bias condition and temperature.

20 Claims, 4 Drawing Sheets

THERMAL CHIRP COMPENSATION IN A CHIRP MANAGED LASER

CROSS-REFERENCE TO RELATED APPLICATIONS

This application is a divisional of U.S. patent application Ser. No. 12/495,460, filed Jun. 30, 2009 and titled THERMAL CHIRP COMPENSATION IN A CHIRP MANAGED LASER, which is incorporated herein by reference in its entirety.

BACKGROUND

Chirped managed lasers (CMLs), such as distributed feedback (DFB) lasers and tunable distributed Bragg reflector (DBR) lasers, are commonly employed to transmit optical signals. For example, CMLs are currently employed in transceivers and transponders for telecom and datacom applications. However, CMLs have traditionally been limited to use in very short reach (<10-km) applications at 10 Gb/s. This limitation is due at least in part to the thermal chirp exhibited by CMLs.

Thermal chirp in CMLs degrades the low frequency response of CMLs, and degrades the low frequency cut off of the frequency response. As a result, CMLs generate pattern dependence, error floor, and/or poor mask margin.

BRIEF SUMMARY OF SOME EXAMPLE EMBODIMENTS

In general, example embodiments of the invention relate to thermal chirp compensation in chirp managed lasers (CMLs), including distributed feedback (DFB) lasers and tunable distributed Bragg reflector (DBR) lasers. Example methods and devices decrease thermal-chirp-induced low frequency cut-off in CMLs.

In one example embodiment, a method for thermal chirp compensation in a CML laser includes several acts. First, a first bias condition and temperature is selected. Next, a first thermal chirp compensation signal is generated. The first thermal chirp compensation signal corresponds to a predetermined level of thermal chirp that is induced in a laser by operating the laser at the first bias condition and temperature. Then, the laser is driven by biasing a first input drive signal with the first thermal chirp compensation signal. Next, a second bias condition and temperature is selected. Then, a second thermal chirp compensation signal is generated. The second thermal chirp compensation signal corresponds to a predetermined level of thermal chirp that is induced in the laser by operating the laser at the second bias condition and temperature. Finally, the laser is driven by biasing a second input drive signal with the second thermal chirp compensation signal.

In another example embodiment, a thermal chirp compensation device includes an analog-to-digital converter, a digital signal processor in electrical communication with the analog-to-digital converter, and a digital-to-analog converter in electrical communication with the digital signal processor. The digital signal processor is configured to generate bias condition and temperature specific thermal chirp compensation signals that each corresponds to a predetermined level of thermal chirp that is induced in a laser by operating the laser at a particular bias condition and temperature.

In yet another example embodiment, a transmitter includes a laser package, a laser driver in electrical communication with the laser package, and a thermal chirp compensation device in communication with the laser package and the laser driver. The laser package includes a laser and an optical spectrum reshaper configured to convert frequency modulated optical signals from the laser into an amplitude modulated optical signals. The thermal chirp compensation device includes means for generating bias condition and temperature specific thermal chirp compensation signals that each corresponds to a predetermined level of thermal chirp that is induced in the laser by operating the laser at a particular bias condition and temperature.

BRIEF DESCRIPTION OF THE DRAWINGS

To further clarify certain aspects of embodiments of the present invention, a more particular description will be rendered by reference to specific embodiments thereof which are disclosed in the appended drawings. It is appreciated that these drawings depict only example embodiments of the invention and are therefore not to be considered limiting of its scope. Aspects of example embodiments will be described and explained with additional specificity and detail through the use of the accompanying drawings in which.

DETAILED DESCRIPTION OF SOME EXAMPLE EMBODIMENTS

Example embodiments of the present invention relate to methods and devices for thermal chirp compensation in chirp managed lasers (CMLs), including distributed feedback (DFB) lasers and tunable distributed Bragg reflector (DBR) lasers. Example methods and devices decrease thermal-chirp-induced low frequency cut-off in tunable CMLs.

1. Example 13 Pin-GPO Butterfly Transmitter Package

Figure 1:
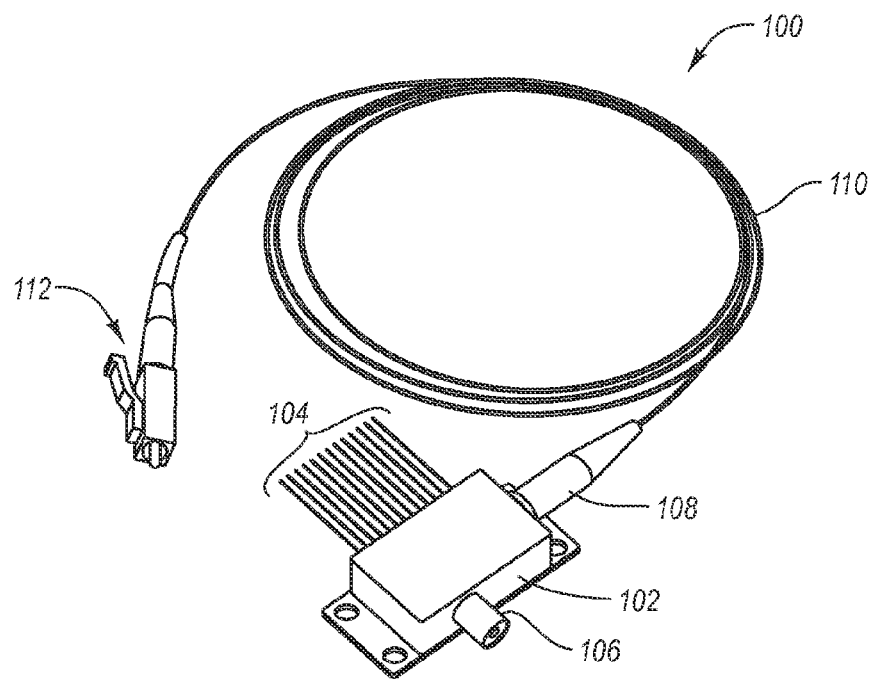
FIG. 1 is a perspective view of an example 13 pin-general purpose output (GPO) butterfly transmitter package.

One environment in which the example methods and devices for thermal chirp compensation disclosed herein can be employed is an example 13 pin-general purpose output (GPO) butterfly transmitter package 100 of FIG. 1. The example transmitter package 100 is configured to transmit 10 Gb/s-100 Gb/s data over physical distances up to 600 km. The example transmitter package 100 includes a housing 102 within which several optical and electrical components are positioned (as discussed elsewhere herein in connection with FIG. 3). The example transmitter package 100 also includes thirteen pins 104, a GPO connector 106, and a fiber pigtail 108 extending from the housing 102. A single-mode fiber 110 is attached to the fiber pigtail 108, and an LC-type fiber connector 112 is attached to the single-mode fiber 110, although the LC-type fiber connector 112 could be replaced with an FC-type fiber connector (not shown).

The example transmitter package 100 is typically mounted to a printed circuit board (PCB) of an optoelectronic module, such as an optoelectronic transmitter module, or an optoelectronic transceiver or transponder module for example (not shown). The PCB is configured to send data and control signals to the internal components of example transmitter package 100 through the pins 104, which results in optical data signals being transmitted to the connector 112 through the fiber pigtail 108 and the single-mode fiber 110.

2. Example TOSA Package

Figure 2:
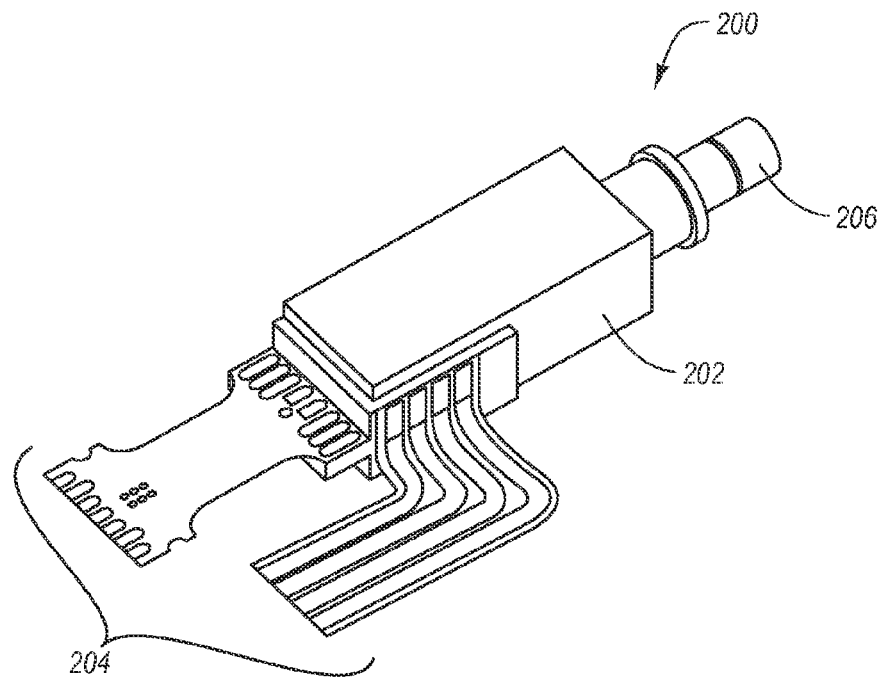
FIG. 2 is a perspective view of an example transmitter optical sub assembly (TOSA) package.

Another environment in which the example methods and devices for thermal chirp compensation disclosed herein can be employed is an example transmitter optical sub assembly (TOSA) package 200 of FIG. 2. The example TOSA package 200 is similarly configured to transmit 10 Gb/x-100 Gb/x data over physical distances up to 600 km. The example TOSA package 200 includes a housing 202 within which several optical and electrical components are positioned (as discussed elsewhere herein in connection with FIG. 3). The example TOSA package 200 also includes 13 pins 204 and an LC-type receptacle 206 extending from the housing 202, although the LC-type receptacle 206 could be replaced with an SC-type receptacle (not shown).

The example TOSA package 200 is typically mounted to a printed circuit board (PCB) of an optoelectronic module, such as an optoelectronic transmitter module, or an optoelectronic transceiver or transponder module for example (not shown). The PCB is configured to send data and control signals to the internal components of example TOSA package 200 through the pins 204, which results in optical data signals being transmitted to the receptacle 206.

3. Example Internal Components

Figure 3:
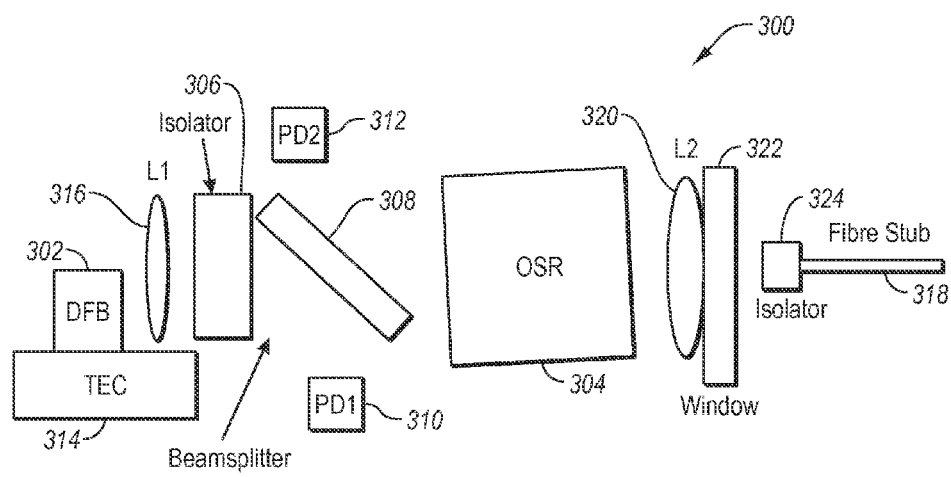
FIG. 3 is a diagram of example components of both the example 13 pin-GPO butterfly transmitter package of FIG. 1 and the example TOSA package of FIG. 2.

With reference now to FIG. 3, example internal components 300 of the example 13 pin-GPO butterfly transmitter package 100 and the example TOSA package 200 are disclosed. The example internal components 300 include a directly modulated DFB laser 302 co-packaged with an optical spectral re-shaper (OSR) 304.

An optical isolator 306 is included between the DFB laser 302 and the OSR 304 while a beam-splitter 308 and two photodetectors 310 and 312 are configured to allow frequency locking. The output power of the DFB laser 302 is monitored by the photodetector 310. The photodetector 312 monitors the back-reflection from the OSR 304. The photocurrent ratio from the two photodetector 310 and 312 is used to lock the relative spectral locations of the DFB laser 302 and the OSR 304 via temperature control of the DFB laser 302 using a thermoelectric cooler 314.

A first lens 316 is used to collimate the DFB laser 302 laser output and pass the beam through the beamsplitter 308 and the OSR 304, prior to coupling into a single-mode fiber 318 using a second lens 320 and a window 322. A second isolator 324 may be included to minimize the effect of external back-reflections on package performance.

4. Example Transmitter

Figure 4:
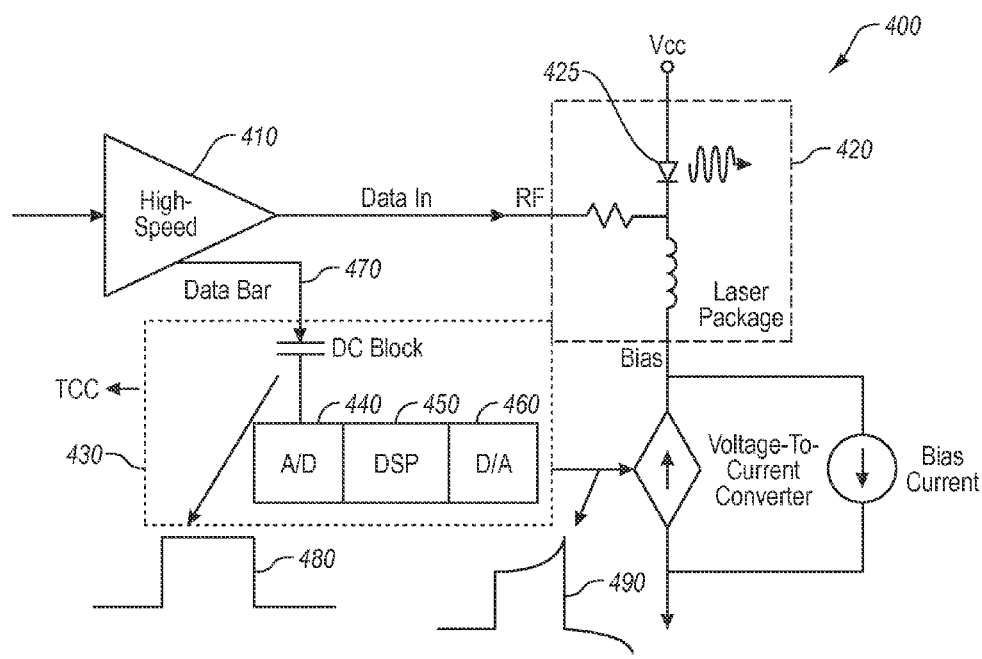
FIG. 4 is a diagram of an example transmitter including an example thermal chirp compensation device.

With reference now to FIG. 4, an example transmitter 400 is disclosed. The example transmitter 400 includes an example high speed driver 410, an example laser package 420, and an example thermal chirp compensation (TCC) device 430. The example high speed driver 410 is configured to convert high speed data signals into input drive signals. The example laser package 420 can be the example 13 pin-GPO butterfly transmitter package 100 or the example TOSA package 200 and may include a DFB laser or a tunable DBR laser, for example. The example laser package 420 includes a laser 425.

The example TCC device 430 includes an analog-to-digital converter 440, a digital signal processor (DSP) 450, and a digital-to-analog converter 460. The DSP 450 is in electrical communication with the analog-to-digital converter 440, and the digital-to-analog converter 460 is in electrical communication with the DSP 450.

The DSP 450 is configured to generate bias condition and temperature specific thermal chirp compensation signals that each corresponds to a predetermined level of thermal chirp that is induced in the laser 425, in a gain section of laser 425 for example, by operating the laser 425 at a particular bias condition and temperature. Further, the DSP 450 can be programmable and may also be in electrical communication with a memory (not shown) that stores calibration data corresponding to each bias condition and temperature at which the laser 425 is capable of operating. In an alternative configuration, instead of the laser package 420 with the single laser 425, the DSP 450 can generate bias condition and temperature specific thermal chirp compensation signals for a multi-section laser package having multiple lasers. In this alternative configuration, the thermal chirp compensation signals can be added to a dedicated section for thermal chirp compensation or to a dedicated section for improving low frequency response.

5. Example Method for Thermal Chirp Compensation in a CML

Figure 5:
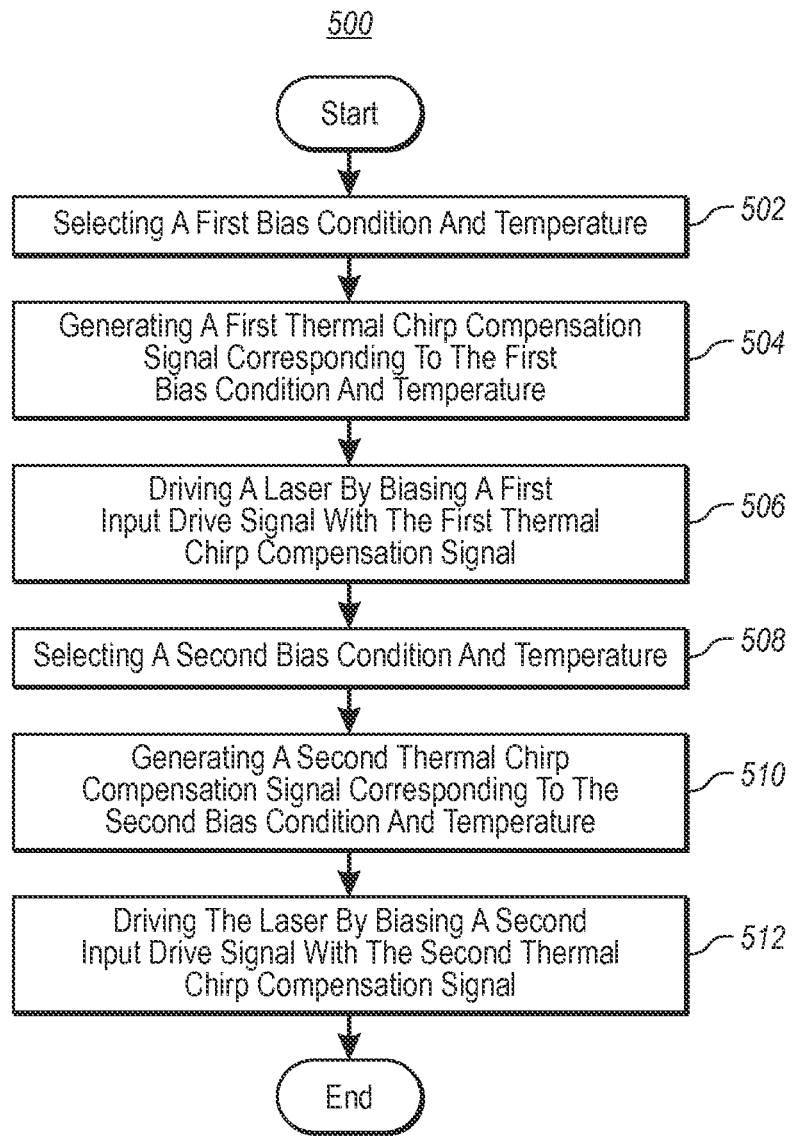
FIG. 5 is a flowchart of an example method for thermal chirp compensation in a CML laser.

With reference now to FIG. 5, an example method for thermal chirp compensation in a CML laser transmitter 500 is disclosed. The example method 500 includes several acts which result in decreased thermal-chirp-induced low frequency cut-off in CMLs. The example method 500 will now be discussed below in connection with FIG. 4.

First, at 502, a first bias condition and temperature is selected. For example, the selected first bias condition and temperature may correspond to a first output wavelength of the output wavelengths at which the laser 425 is capable of operating. The first output wavelength may be one of the ITU-T C-band and L-band channels that are between 1527.773 nm and 1605.744 nm. The first output wavelength may also be communicated to the TCC device 430 through the communication line 470.

Next, at 504, a first thermal chirp compensation signal is generated. The first thermal chirp compensation signal corresponds to a predetermined level of thermal chirp that is induced in the laser 425 by operating the laser 425 at the first bias condition and temperature. For example, the DSP 450 may communicate with a memory (not shown) that stores calibration data corresponding to each bias condition and temperature at which the laser 425 is capable of operating. This calibration data may then be used by the DSP 450 to calculate the first thermal chirp compensation signal. The DSP may generate a first thermal chirp compensation signal by solving the following formula for the first compensation signal $S_{comp}$:

$$S_{comp}*H(t)+S_{input\ drive}(t)*H(t)=S_{comp\ drive}(t)$$

where:

H(t) is a transform function of the predetermined level of thermal chirp that is induced in the laser 425 by operating the laser 425 at the first bias condition and temperature;

$S_{input\ drive}$ (t) is the first input drive Signal;

$S_{comp\ drive}$ (t) is a compensated first input drive signal; and

* is a convolution operator.

H(t) may be calculated by de-convolving $S_{input\ drive}$ (t) and an output signal of the laser 425 that is driven without compensation. H(t) may alternatively be calculated using a fast Fourier transform (FFT).

Then, at 506, the laser is driven by biasing a first input drive signal with the first thermal chirp compensation signal. For example, the laser 425 is driven by biasing a first input drive signal 480 with the first thermal chirp compensation signal 490.

Next, at 508, a second bias condition and temperature is selected. For example, the selected second bias condition and temperature may correspond to a second output wavelength of the ITU-T C-band and L-band channels that is different from the first output wavelength corresponding to the selected first bias condition and temperature selected at 502.

Then, at 510, a second thermal chirp compensation signal is generated. The second thermal chirp compensation signal corresponds to a predetermined level of thermal chirp that is induced in the laser by operating the laser at the second bias condition and temperature. For example, the DSP 450 may communicate with a memory (not shown) that stores calibration data corresponding to the second output wavelength corresponding to the selected second bias condition and temperature. This calibration data may then be used by the DSP 450 to calculate the second thermal chirp compensation signal. The DSP 450 may generate the second thermal chirp compensation signal by solving the following formula above for the first compensation signal $S_{comp}$ using updated H(t), $S_{input\ drive}$ (t), and $S_{comp\ drive}$ (t) parameters.

Finally, at 512, the laser is driven by biasing a second input drive signal with the second thermal chirp compensation signal. For example, the laser 425 is driven by biasing the second input drive signal 480 with the second thermal chirp compensation signal 490.

Figure 6:
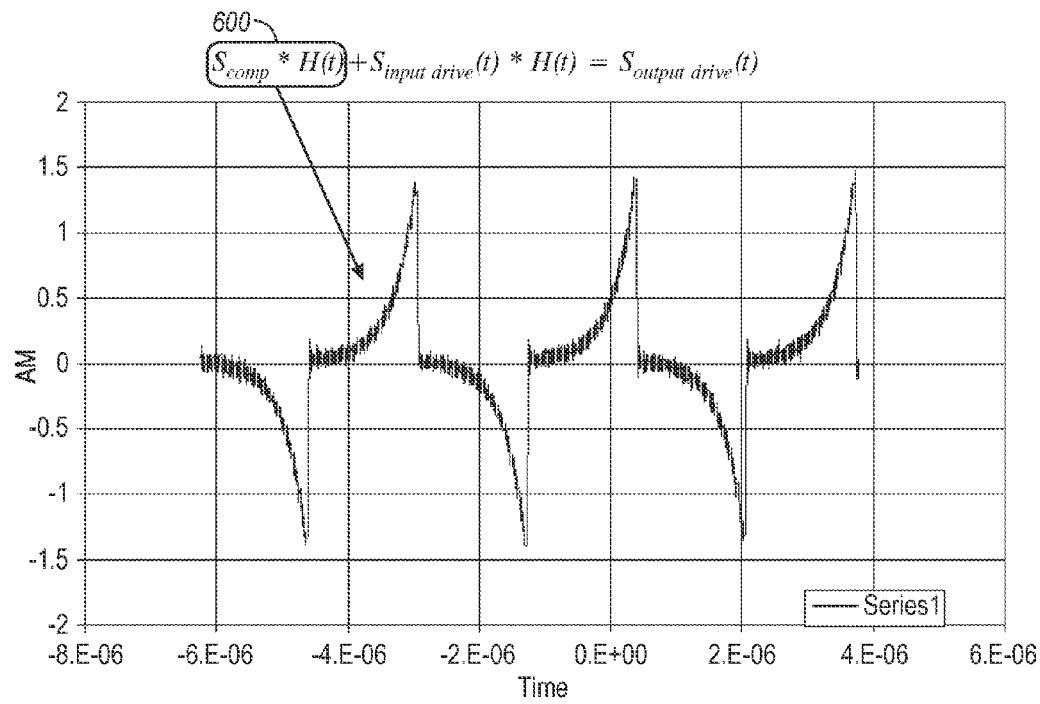
FIG. 6 is a chart showing an example thermal chirp compensation signal.
Figure 7:
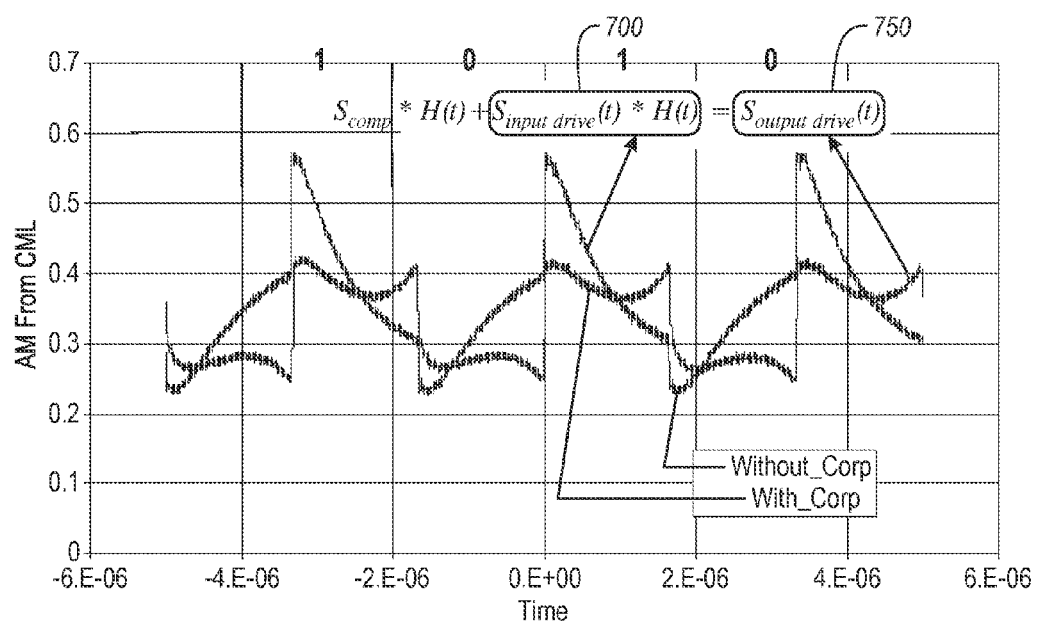
FIG. 7 is a chart showing example drive signals with and without thermal chirp compensation.

With reference now to FIG. 6, an example thermal chirp compensation signal 600 is disclosed. With reference to FIG. 7, example drive signals without thermal chirp compensation 700 and with thermal chirp compensation 750 are disclosed. The example drive signal with thermal chirp compensation 750 reduces the thermal-chirp-induced low frequency cut-off visible in the example drive signals without thermal chirp compensation 700.

The example embodiments disclosed herein may be embodied in other specific forms. The example embodiments disclosed herein are to be considered in all respects only as illustrative and not restrictive.

What is claimed is:

1. A transmitter comprising:
   a laser package comprising a laser and an optical spectrum reshaper configured to convert frequency modulated optical signals from the laser into an amplitude modulated optical signals;
   a laser driver in electrical communication with the laser package; and
   a thermal chirp compensation device in communication with the laser package and the laser driver, the thermal chirp compensation device comprising:
   means for generating bias condition and temperature specific thermal chirp compensation signals that each corresponds to a predetermined level of thermal chirp that is induced in the laser by operating the laser at a particular bias condition and temperature, the bias condition and temperature specific thermal chirp compensation signals based at least in part on calibration data corresponding to bias conditions and temperatures of the laser.

2. The transmitter as recited in claim 1, wherein the laser package is a transmitter optical sub assembly (TOSA) package.

3. The transmitter as recited in claim 1, wherein the laser package is a 13 pin-general purpose output (GPO) butterfly transmitter package.

4. A transmitter comprising:
   a laser package comprising a laser and an optical spectrum reshaper configured to convert frequency modulated optical signals from the laser into an amplitude modulated optical signals;
   a laser driver in electrical communication with the laser package; and
   a thermal chirp compensation device in communication with the laser package and the laser driver, the thermal chirp compensation device comprising:
   means for generating bias condition and temperature specific thermal chirp compensation signals that each corresponds to a predetermined level of thermal chirp that is induced in the laser by operating the laser at a particular bias condition and temperature, wherein the means for generating bias condition and temperature specific thermal chirp compensation signals $S_{comp}$ functions according to the following formula:

$$S_{comp}*H(t)+S_{input\ drive}(t)*H(t)=S_{output\ drive}(t)$$

where:

H (t) is a transform function of the predetermined level of thermal chirp that is induced in the laser by operating the laser at a particular bias condition and temperature;

$S_{input\ drive}$ (t) is the first input drive signal;

$S_{output\ drive}$ (t) is a compensated first input drive signal; and

* is a convolution operator.

5. The transmitter as recited in claim 4, wherein the means for generating bias condition and temperature specific thermal chirp compensation signals comprises:
   a digital signal processor configured to generate bias condition and temperature specific thermal chirp compensation signals that each corresponds to a predetermined level of thermal chirp that is induced in a laser by operating the laser at a particular bias condition and temperature.

6. The transmitter as recited in claim 4, wherein H (t) is calculated by de-convolving $S_{input\ drive}$ (t) and an output signal of the laser that is driven without compensation.

7. The transmitter as recited in claim 4, wherein H (t) is calculated using an FFT.

8. The transmitter as recited in claim 1, the laser package further comprising a plurality of sections, a first section of the plurality of sections including the laser, and a second section of the plurality of sections including a second laser, wherein the thermal chirp compensation device is in communication with the first section of the laser package and is not in communication with the second section of the laser package.

9. The transmitter as recited in claim 5, wherein the digital signal processor is programmable.

10. The transmitter as recited in claim 5, further comprising a memory in electrical communication with the digital signal processor, wherein the memory stores calibration data corresponding to each bias condition and temperature at which the laser is capable of operating.

11. The transmitter as recited in claim 1, wherein the laser comprises a DFB laser or a DBR laser.

12. A transmitter comprising:
a laser;
an optical spectrum reshaper configured to convert frequency modulated optical signals from the laser into an amplitude modulated optical signals;
a laser driver in electrical communication with the laser;
an analog-to-digital converter in electrical communication with the laser driver;
a digital signal processor in electrical communication with the analog-to-digital converter, the digital signal processor being configured to generate bias condition and temperature specific thermal chirp compensation signals that each corresponds to a predetermined level of thermal chirp that is induced in the laser by operating the laser at a particular bias condition and temperature; and
a digital-to-analog converter in electrical communication with the digital signal processor.

13. The transmitter as recited in claim 12, further comprising a memory in electrical communication with the digital signal processor, wherein the memory stores calibration data corresponding to each bias condition and temperature at which the laser is capable of operating.

14. The transmitter as recited in claim 12, wherein the digital signal processor is configured to generate bias condition and temperature specific thermal chirp compensation signals $S_{comp}$ according to the following formula:

$$S_{comp}*H(t)+S_{input\ drive}(t)*H(t)=S_{output\ drive}(t)$$

where:
H (t) is a transform function of the predetermined level of thermal chirp that is induced in a laser by operating the laser at a particular bias condition and temperature;
$S_{input\ drive}$ (t) is the first input drive signal;
$S_{output\ drive}$ (t) is a compensated first input drive signal; and
* is a convolution operator.

15. The transmitter as recited in claim 14, wherein H (t) is calculated by de-convolving $S_{input\ drive}$ (t) and an output signal of the laser that is driven without compensation.

16. The transmitter as recited in claim 14, wherein H (t) is calculated using an FFT.

17. The transmitter as recited in claim 12, wherein the laser comprises a DFB laser or a DBR laser.

18. The transmitter as recited in claim 1, wherein the calibration data corresponds to each bias condition and temperature at which the laser is capable of operating.

19. The transmitter as recited in claim 4, wherein the laser package is a transmitter optical sub assembly (TOSA) package.

20. The transmitter as recited in claim 4, wherein the laser package is a 13 pin-general purpose output (GPO) butterfly transmitter package.

* * * * *